United States Patent
Chu-Ke et al.

(10) Patent No.: US 10,204,573 B2
(45) Date of Patent: Feb. 12, 2019

(54) PIXEL MATRIX AND DISPLAY METHOD THEREOF

(71) Applicant: AU Optronics Corporation, Hsin-Chu (TW)

(72) Inventors: Hui Chu-Ke, Hsin-Chu (TW); Sheng-Wen Cheng, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 15/706,876

(22) Filed: Sep. 18, 2017

(65) Prior Publication Data

US 2018/0190729 A1   Jul. 5, 2018

(30) Foreign Application Priority Data

Dec. 29, 2016   (TW) .............................. 105143996 A

(51) Int. Cl.
  *G09G 3/36* (2006.01)
  *H01L 27/32* (2006.01)
  *G09G 3/20* (2006.01)

(52) U.S. Cl.
  CPC ......... *G09G 3/3607* (2013.01); *G09G 3/2003* (2013.01); *H01L 27/3213* (2013.01); *H01L 27/3218* (2013.01); *H01L 27/3244* (2013.01); *G09G 2300/0452* (2013.01); *G09G 2320/028* (2013.01); *G09G 2320/0276* (2013.01); *G09G 2340/0457* (2013.01)

(58) Field of Classification Search
  CPC ... G09G 2300/0452; G09G 2340/0457; G09G 2320/0673; G09G 2320/028; G09G 2320/068; G09G 2300/0443; G09G 3/2074; G09G 3/3648; G02F 2201/52; G02F 1/1323

See application file for complete search history.

(56) References Cited

U.S. PATENT DOCUMENTS

| | | | |
|---|---|---|---|
| 6,417,864 B1 | 7/2002 | Jones et al. | |
| 7,248,268 B2 | 7/2007 | Brown Elliott et al. | |
| 7,515,122 B2 | 4/2009 | Miller et al. | |

(Continued)

FOREIGN PATENT DOCUMENTS

| | | |
|---|---|---|
| CN | 100444231 C | 12/2008 |
| TW | I447490 | 8/2014 |

(Continued)

*Primary Examiner* — Sanjiv D. Patel
(74) *Attorney, Agent, or Firm* — WPAT, PC

(57) ABSTRACT

A pixel matrix having a plurality of pixel units. Each pixel unit has at least 12 sub-pixels arranged in matrix manner. The pixel unit has at least 4 first color sub-pixels, at least 4 second color sub-pixels, and at least 4 third color sub-pixels. Each two of the first color sub-pixels are arranged adjacent to each other to form at least 2 first color sub-pixel pairs, and the first color sub-pixel pairs are separately provided in different columns and different rows of the pixel unit. Each two of the second color sub-pixels are arranged adjacent to each other to form at least 2 second color sub-pixel pairs, and the second color sub-pixel pairs are separately provided in different columns and different rows of the pixel unit. Each first color sub-pixel pair and each second color sub-pixel pair are arranged adjacent to each other in a column direction.

15 Claims, 13 Drawing Sheets

(56) References Cited

U.S. PATENT DOCUMENTS

| | | |
|---|---|---|
| 7,525,526 B2 | 4/2009 | Brown Elliott et al. |
| 7,583,279 B2 | 9/2009 | Brown Elliott et al. |
| 7,829,887 B2 | 11/2010 | Chang et al. |
| 7,948,507 B2 | 5/2011 | Okada et al. |
| 8,378,947 B2 | 2/2013 | Im et al. |
| 8,810,491 B2 | 8/2014 | Wu et al. |
| 2004/0174375 A1* | 9/2004 | Credelle .............. G09G 3/3607 345/589 |
| 2007/0024183 A1* | 2/2007 | Lih ..................... H01L 51/56 313/504 |
| 2007/0252797 A1* | 11/2007 | Huang ................. G09G 3/2003 345/87 |
| 2009/0015768 A1 | 1/2009 | Igeta et al. |
| 2009/0153454 A1* | 6/2009 | Irie ..................... G09G 3/3648 345/89 |
| 2010/0156279 A1 | 6/2010 | Tamura et al. |
| 2012/0280895 A1 | 11/2012 | Yeh et al. |
| 2014/0085439 A1* | 3/2014 | Niwano ............. G02B 27/2214 348/56 |
| 2014/0211128 A1 | 7/2014 | Yang et al. |
| 2015/0302808 A1 | 10/2015 | Wang et al. |
| 2016/0027376 A1* | 1/2016 | Chen .................... G09G 3/3208 345/694 |
| 2016/0035266 A1* | 2/2016 | Li ........................ G09G 3/2003 345/205 |
| 2016/0204094 A1* | 7/2016 | Yang .................... H01L 27/124 257/773 |
| 2016/0335946 A1 | 11/2016 | Chen et al. |
| 2017/0039918 A1* | 2/2017 | Tsao .................... G09G 3/2003 |
| 2017/0200415 A1* | 7/2017 | Noguchi .............. G09G 3/3258 |

FOREIGN PATENT DOCUMENTS

| | | |
|---|---|---|
| TW | 201640656 A | 11/2016 |
| WO | WO2004021323 A2 | 3/2004 |

* cited by examiner 310 320

440

450

510

520

530

540

PIXEL MATRIX AND DISPLAY METHOD THEREOF

BACKGROUND

Technical Field

The present disclosure relates to a pixel matrix, and in particular, to a display apparatus having a peep-proof display function.

Related Art

Recently, various products of liquid crystal display apparatuses have been considerably popularized in mobile hand-held apparatuses. In addition, because intelligent terminal apparatuses are widely used, integrating a touch function on an intelligent terminal apparatus has been a popular requirement of current products.

It is known that a display apparatus having a peep-proof function comprises a display panel, a peep-proof layer, and a backlight module. The peep-proof layer generally selects an optical film combination of a light control film, a prism film, a diffuser, and the like to obtain a peep-proof effect. A light control film may further be added outside the display panel to achieve the peep-proof function by changing large viewing angle light. However, because a light control film generally has a fixed optical structure and light distribution after light passes through the light control film is limited to the limitation of the construction of the light control film, and consequently, light leaks to some extent in a case of a wide viewing angle, and therefore display quality and peep-proof capability are affected, and wide viewing angle luminance of the display apparatus is reduced. At the same time, optical film materials such as a light control film are expensive, and a thickness of a display module is also increased.

Therefore, how to achieve good peep-proof effects in a case in which optical films and costs are not increased is really one of current important research and development problems.

SUMMARY

According to an implementation manner of the present disclosure, a pixel matrix is disclosed, wherein each pixel unit comprises at least 12 sub-pixels arranged in matrix manner along a column direction and a row direction, and each pixel unit comprises: at least 4 first color sub-pixels, at least 4 second color sub-pixels, and at least 4 third color sub-pixels, wherein the first color, the second color, and the third color are different colors. The column direction is not parallel to the row direction. Each two of the first color sub-pixels are arranged adjacent to each other to form at least 2 first color sub-pixel pairs, and the first color sub-pixel pairs are separately provided in different columns and different rows of the pixel unit; and each two of the second color sub-pixels are arranged adjacent to each other to form at least 2 second color sub-pixel pairs, and the second color sub-pixel pairs are separately provided in different columns and different rows of the pixel unit; and each first color sub-pixel pair and each second color sub-pixel pair are arranged adjacent to each other in the column direction.

According to an implementation manner of the present disclosure, a display apparatus is disclosed, comprising: a display panel, comprising a plurality of pixel units, wherein each pixel unit comprises: at least 2 first color sub-pixel pairs, each of which is formed by 2 first color sub-pixels arranged adjacent to each other, wherein the first color sub-pixel pairs are separately provided in different columns and different rows of the pixel unit; at least 2 second color sub-pixel pairs, each of which is formed by 2 second color sub-pixels arranged adjacent to each other, wherein the second color sub-pixel pairs are separately provided in different columns and different rows of the pixel unit; and at least 2 third color sub-pixel pairs, each of which is formed by 2 third color sub-pixels arranged adjacent to each other, wherein each first color sub-pixel pair and each second color sub-pixel pair are arranged adjacent to each other in the column direction, and each pixel unit comprises at least 12 sub-pixels arranged in matrix manner along a column direction and a row direction; an input unit, configured to receive an image signal; and a sub pixel rending (SPR) unit, comprising a wide viewing angle gamma lookup table and a narrow viewing angle gamma lookup table for performing sub pixel rendering on an image signal, so that the sub-pixels of the display panel generate corresponding performance values.

According to an implementation manner of the present disclosure, a display method is further disclosed, which is used for driving the foregoing display apparatus and comprises: receiving the image signal to the input unit; when the display apparatus is in a narrow viewing angle display mode, the method comprises: receiving an interference pattern to the input unit, wherein the interference pattern comprises a dark zone and a bright zone; generating, by an image signal of the bright zone, a narrow viewing angle performance value according to the narrow viewing angle gamma lookup table and a sub pixel rendering unit; adjusting, by the SPR unit, the narrow viewing angle performance value as a first performance value and a second performance value when the narrow viewing angle performance value is not greater than a preset performance value, wherein the preset performance value is related to the wide viewing angle gamma lookup table; and separately outputting the first performance value and the second performance value to the sub-pixels of one of the sub-pixel pairs of the bright zone.

Both the foregoing general description about the present disclosure and the following detailed description about the embodiments are exemplary and are intended to explain the principles of the present disclosure, and provide further explanation of the claims of the present disclosure.

DETAILED DESCRIPTION

Figure 1:
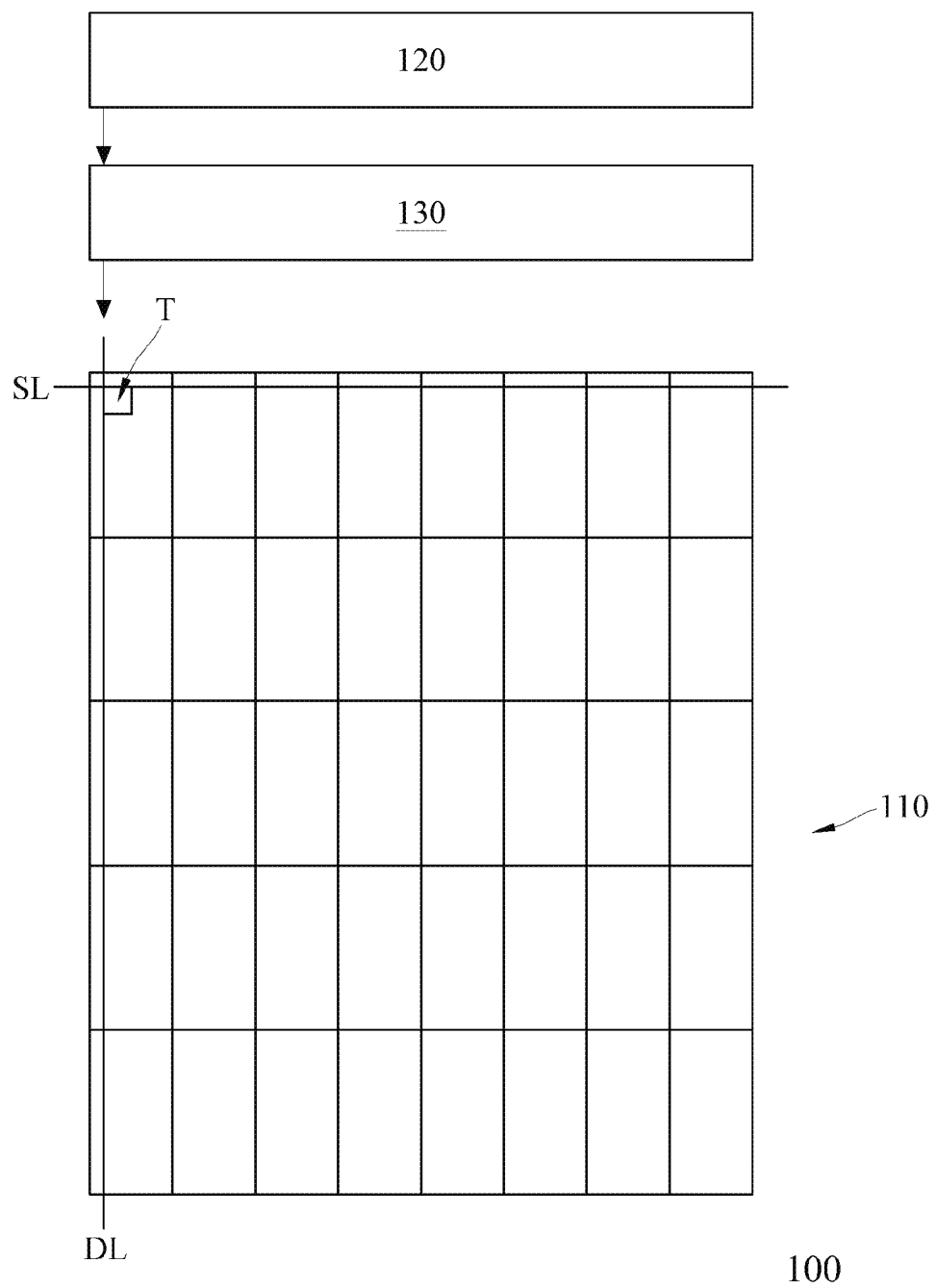
FIG. 1 is a schematic block diagram of a display apparatus of an implementation manner of the present disclosure.

Implementation manners accompanied with figures are described in detail below. However, the implementation manners provided are not intended to limit the scope of the present disclosure. The description of structures and operations are not intended to limit the order of execution. Any structure formed by recombining elements shall fall within the scope of the present disclosure as long as an equivalent apparatus can be generated. In addition, the figures are merely provided for the purpose of description, but are not drawn to scale. Like or similar elements are denoted by like reference numerals in the following description to facilitate understanding.

Figure 2A:
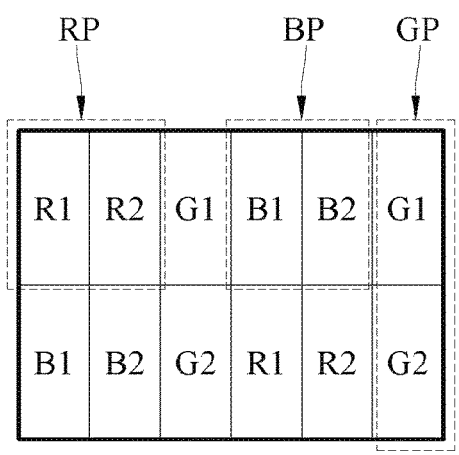
FIG. 2A is a schematic top view of a first implementation manner of a pixel unit of the present disclosure.

FIG. 1 is a schematic block diagram of a display apparatus of an implementation manner of the present disclosure. FIG. 2A is a schematic top view of a first implementation manner of a pixel unit of the present disclosure.

Referring to FIG. 1, a display apparatus 100 comprises a display panel 110, an input unit 120, and an SPR unit 130. The input unit 120 is configured to receive an image signal from outside. The SPR unit 130 is configured to perform sub pixel rendering according to the image signal received by the input unit 120. The input unit 120 and the SPR unit 130 may be integrated in a data driver (not drawn) or a timing controller (not drawn). After performing sub pixel rending on the image signal, the SPR unit 130 transforms the image signal from original color sub-pixel arrangement into a matrix arranged by specific color sub-pixels, and outputs corresponding performance values thereof. The sub-pixel performance values may be output to each sub-pixel of the display panel 110 by the data driver.

Referring to FIG. 1 and FIG. 2A at the same time, the display panel 110 comprises a plurality of pixel units 210 arranged in matrix manner. People that apply the present implementation manner can adjust a quantity of columns and rows of the matrix (that is, a quantity of the pixel units 210) according to design requirements thereof. In addition, for ease of description, FIG. 2A draws only one pixel unit 210.

Referring to FIG. 2A, each pixel unit 210 comprises 12 sub-pixels arranged in 2 rows and 6 columns (2×6), which are respectively 4 first color sub-pixels R, 4 second color sub-pixels B, and 4 third color sub-pixels G; the following sub-pixel R, sub-pixel G, and sub-pixel B are used to represent sub-pixels of different colors; the foregoing axial direction defines a row direction as a horizontal direction and defines a column direction as a vertical direction. Each sub-pixel R, each sub-pixel B, and each sub-pixel G separately comprises a corresponding scan line SL, a corresponding data line DL, and a driving element T. The driving element T is electrically connected to a corresponding scan line SL and a corresponding data line DL. In addition, although the pixel units of the display apparatus 100 of FIG. 1 are implemented by the pixel unit 210 shown in FIG. 2A, the present disclosure is not limited thereto. In other implementation manners, the pixel units may also be implemented by a pixel unit 220 shown in FIG. 2B. In addition, the pixel units disclosed in the present disclosure are similar to the pixel unit 210 of FIG. 2A, and therefore same or similar elements are represented by same or similar symbols, and repeated description will not be made.

In addition, the display panel 110 may be any means that can display an image, and may be a non-self-luminous display panel, such as a liquid crystal display (LCD), an electrophoretic display panel, or an electrowetting display panel, or a self-luminous display panel, such as an organic light-emitting diode (OLED) display panel, a plasma display panel, or a field emission display panel. Specifically, in a case in which the display panel 110 is an LCD, the driving element T, for example, is a thin film transistor (TFT); if the display panel 110 is an OLED display panel, the driving element T, for example, is a driving circuit that comprises two transistors and one capacitor, but the present disclosure is not limited thereto.

In detail, the display panel 110 may comprise an upper substrate and a lower substrate (not drawn), and the upper substrate may be provided with a black matrix. If the display panel 110 is an LCD, the black matrix has a plurality of openings, and a plurality of color patterns is separately provided in the openings to make corresponding sub-pixels display performance values thereof to the display panel 110. If the display panel 110 is an OLED, a plurality of pixel electrodes is separately provided in the openings to make corresponding sub-pixels display performance values thereof to the display panel 110. In addition, the lower substrate may be configured as an element layer, which may comprise means, such as scan lines, data lines, a driving element, a pixel electrode, and a protection layer (not drawn). It should be noted that a performance value of a sub-pixel may be a performance value such as hue, value, saturation, luminance, or grey level obtained after signal processing is performed on an image signal received by the sub-pixel. One implementation manner of the present disclosure uses grey level as an example, but the present disclosure is not limited thereto. For example, color performances, for example, normalized luminance may be 0 to 1, normalized hue may be 0 to 360 degrees, normalized value may be 0 to 100, normalized saturation may be greater than or equal to 0, and normalized grey level may be 0 to 255 all can be used as performance values of sub-pixels.

In addition, the first color, second color, third color, and fourth color disclosed in the present disclosure are different colors, and may be blue, green, and red, blue, green, red, and white, or the like, and the present disclosure is not limited thereto. The sub-pixel R, sub-pixel G, sub-pixel B, and sub-pixel W disclosed in the present disclosure may respectively represent a red sub-pixel, a green sub-pixel, a blue sub-pixel, and a white sub-pixel, but are not intended to limit, and are only used as marks.

Aperture opening ratios of the sub-pixel R, sub-pixel G, sub-pixel B, and sub-pixel W (that is, a luminous area, or an area covered by a pixel electrode) disclosed in the present disclosure may be equal or unequal, and need to be adjusted in design according to actual requirements, and a non-self-luminous area may be covered by a black matrix or another light-proof material. Shapes of the sub-pixel R, sub-pixel G, sub-pixel B, and sub-pixel W of an implementation manner of the present disclosure may be rectangles, polygons or circles, and the present disclosure is not limited thereto. In an implementation manner of the present disclosure, the shapes are only rectangles.

One row and one column disclosed in the present disclosure refers to that a single sub-pixel has a 1×1 matrix space. A same row or a same column refers to a trend direction presented by sub-pixels and a black matrix surrounding the sub-pixels.

Figure 2B:
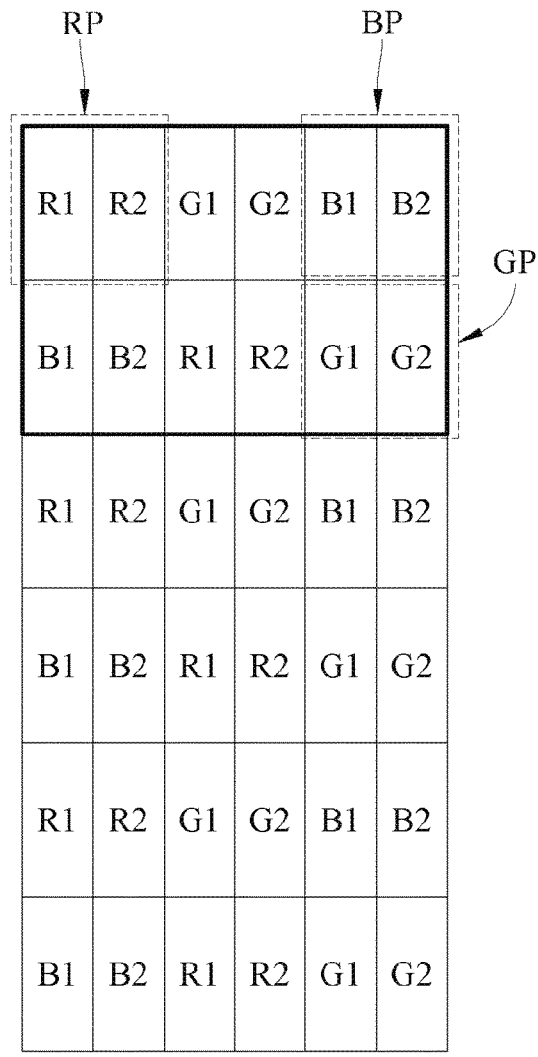
FIG. 2B is a schematic top view of a second implementation manner of a pixel unit of the present disclosure.
Figure 2C:
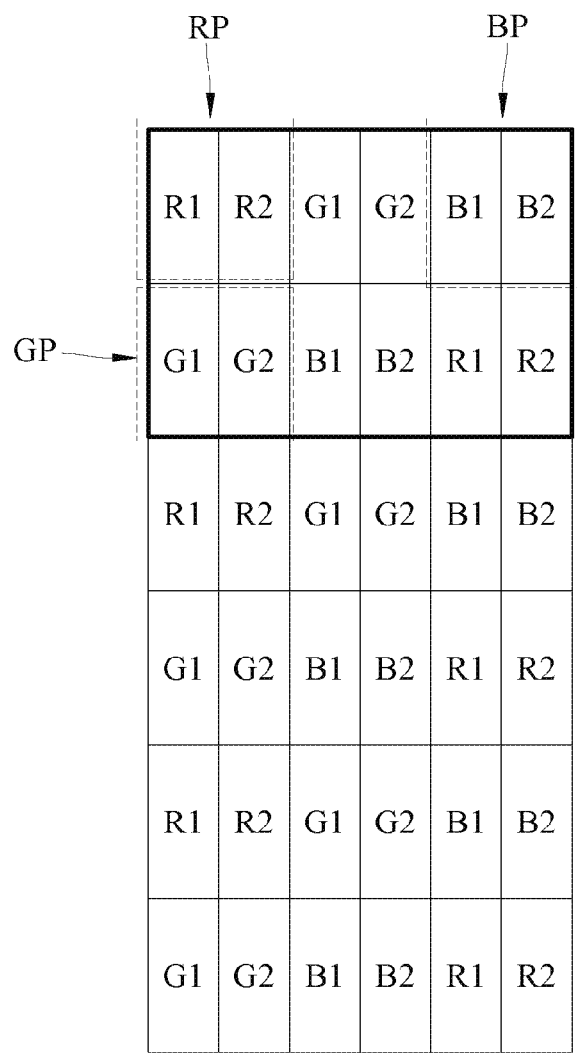
FIG. 2C is a schematic top view of a third implementation manner of a pixel unit of the present disclosure.

FIG. 2A to 2C are schematic top views of a first implementation manner to a third implementation manner of a pixel unit of the present disclosure, and the implementation manners relate to a pixel unit having three-primary color display.

Referring to FIG. 2A to 2C at the same time, in the first implementation manner to the third implementation manner of the pixel unit of the present disclosure, the pixel unit is formed by 4 sub-pixels R, 4 sub-pixels B, and 4 sub-pixels G, which are arranged in a form of a 2×6 matrix, and the pixel unit comprises sub-pixels of three different colors in each row direction. The pixel unit comprises 2 first color sub-pixel pairs, 2 second color sub-pixel pairs, and 2 third color sub-pixel pairs, wherein each two sub-pixels of a same color are arranged adjacent to each other to form a sub-pixel pair, that is, two sub-pixels R arranged adjacent to each other is a sub-pixel pair RP, two sub-pixels G arranged adjacent to each other is a sub-pixel pair GP, and two sub-pixels B arranged adjacent to each other is a sub-pixel pair BP. In addition, 2 sub-pixel pairs RP in adjacent rows are located in different columns and different rows of the pixel unit 210; 2 sub-pixel pairs BP in adjacent rows are located in different columns and different rows of the pixel unit 210; and a sub-pixel pair RP and a sub-pixel pair BP in adjacent rows are located on a same column and different rows of the pixel unit 210.

Referring to FIG. 2A, the pixel unit 210 comprises 2 sub-pixels R arranged along a same row and two adjacent columns to form a sub-pixel pair RP (that is, a form of a 1×2 matrix), 2 sub-pixels B arranged along a same row and two adjacent columns to form a sub-pixel pair BP, and 2 sub-pixels G arranged along a same column and two adjacent rows to form a sub-pixel pair GP (that is, a form of a 2×1 matrix). In addition, 2 sub-pixel pairs RP in adjacent rows are located in different columns and different rows of the pixel unit 210; 2 sub-pixel pairs BP in adjacent rows are located in different columns and different rows of the pixel unit 210; a sub-pixel pair RP and a sub-pixel pair BP in adjacent rows are located on a same column and different rows of the pixel unit 210; a sub-pixel pair GP is located in a same row and different columns of the pixel unit; and two opposite sides of the sub-pixel pair GP are respectively adjacent to the sub-pixel pair RP and the sub-pixel pair BP. More specifically, 2 sub-pixel pairs GP in a pixel unit 210 are arranged non-adjacent to each other. In addition, one row of the pixel unit 210 may be in an arrangement form of RRGBBG from left to right, and the other row of the pixel unit 210 may be in an arrangement form of BBGRRG from left to right (arrangement 1).

Referring to FIG. 2B, a pixel unit 220 comprises 2 sub-pixels R arranged along a same row and two adjacent columns to form a sub-pixel pair RP (that is, a form of a 1×2 matrix), 2 sub-pixels B arranged along a same row and two adjacent columns to form a sub-pixel pair BP, and 2 sub-pixels G arranged along a same row and two adjacent columns to form a sub-pixel pair GP. In addition, 2 sub-pixel pairs RP in adjacent rows are located in different columns and different rows of the pixel unit 220; 2 sub-pixel pairs BP in adjacent rows are located in different columns and different rows of the pixel unit 220; 2 sub-pixel pairs GP in adjacent rows are located in different columns and different rows of the pixel unit 220; and two opposite sides of the sub-pixel pair GP are respectively adjacent to the sub-pixel pair RP and the sub-pixel pair BP. More specifically, one row of the pixel unit 220 may be in an arrangement form of RRGGBB from left to right, and another row of the pixel unit 220 may be in an arrangement form of BBRRGG from left to right (arrangement 2).

Referring to FIG. 2C, a pixel unit 230 is approximately similar to the pixel unit 220, and comprises 2 sub-pixels R arranged along a same row and two adjacent columns to form a sub-pixel pair RP (that is, a form of a 1×2 matrix), 2 sub-pixels B arranged along a same row and two adjacent columns to form a sub-pixel pair BP, and 2 sub-pixels G arranged along a same row and two adjacent columns to form a sub-pixel pair GP. In addition, 2 sub-pixel pairs RP in adjacent rows are located in different columns and different rows of the pixel unit 230; 2 sub-pixel pairs BP in adjacent rows are located in different columns and different rows of the pixel unit 230; 2 sub-pixel pairs GP in adjacent rows are located in different columns and different rows of the pixel unit 230; and two opposite sides of the sub-pixel pair GP are respectively adjacent to the sub-pixel pair RP and the sub-pixel pair BP. More specifically, one row of the pixel unit 230 may be in an arrangement form of RRGGBB from left to right, and another row of the pixel unit 230 may be in an arrangement form of BBRRGG from left to right (arrangement 3).

Figure 3A:
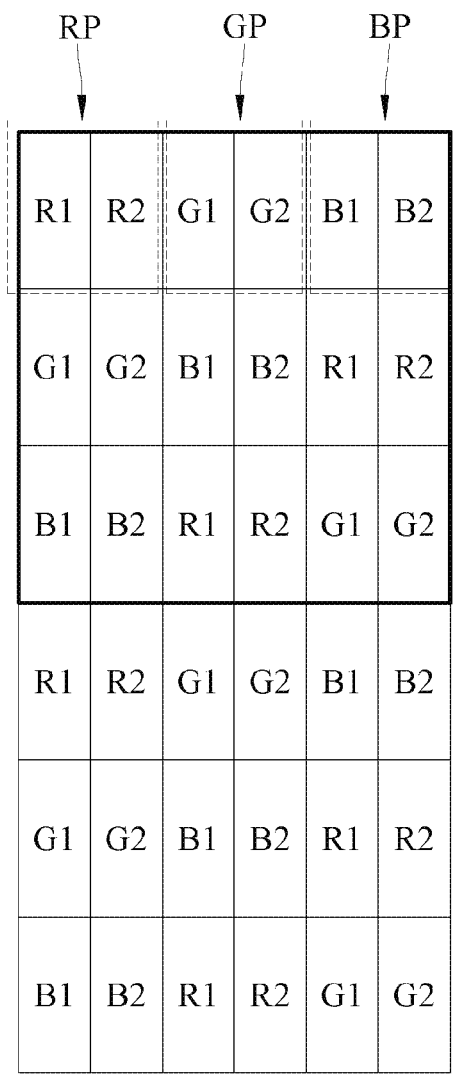
FIG. 3A is a schematic top view of a fourth implementation manner of a pixel unit of the present disclosure.
Figure 3B:
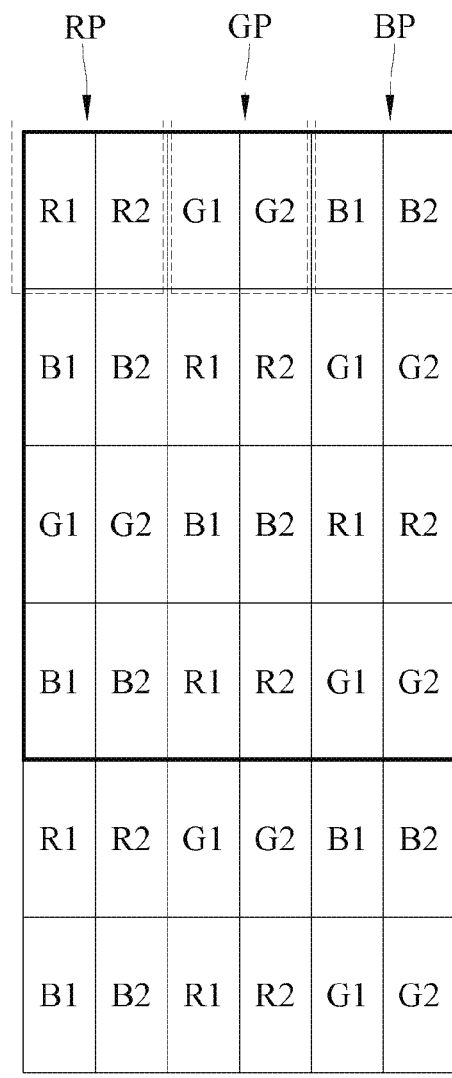
FIG. 3B is a schematic top view of a fifth implementation manner of a pixel unit of the present disclosure.
Figure 3C:
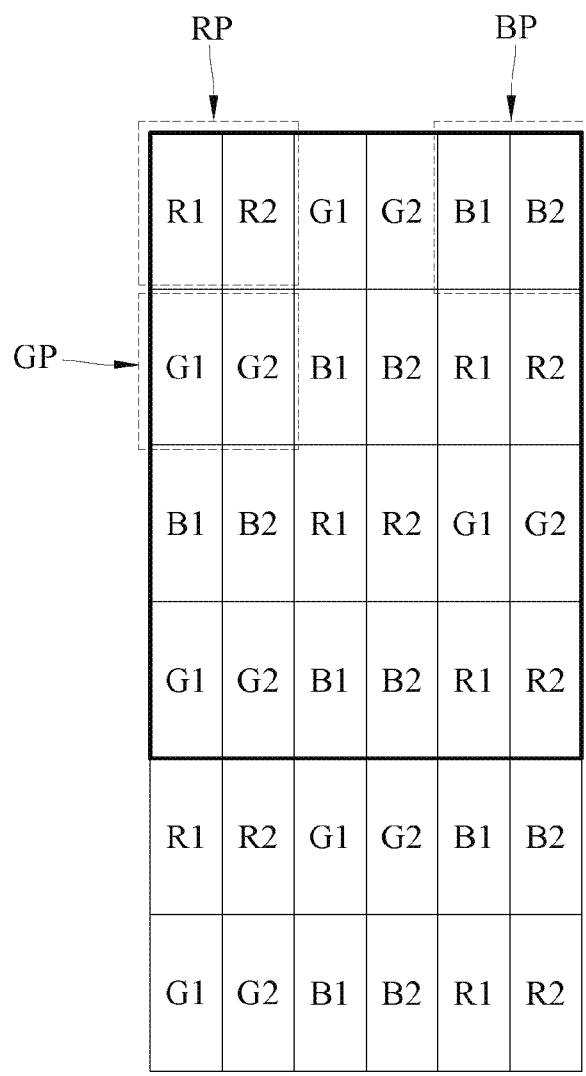
FIG. 3C is a schematic top view of a sixth implementation manner of a pixel unit of the present disclosure.

FIG. 3A to 3C are schematic top views of a fourth implementation manner to a sixth implementation manner of a pixel unit of the present disclosure, and the implementation manners relate to a pixel unit having three-primary color display.

Referring to FIG. 3A, a pixel unit 310 is formed by 6 sub-pixels R, 6 sub-pixels B, and 6 sub-pixels G arranged in a form of a 3×6 matrix; the pixel unit comprises sub-pixels of three different colors in each row direction. The pixel unit comprises 3 first color sub-pixel pairs, 3 second color sub-pixel pairs, and 3 third color sub-pixel pairs, wherein each two sub-pixels of a same color are arranged adjacent to each other to form a sub-pixel pair, that is, two sub-pixels R arranged adjacent to each other is a sub-pixel pair RP, two sub-pixels G arranged adjacent to each other is a sub-pixel pair GP, and two sub-pixels B arranged adjacent to each other is a sub-pixel pair BP. In addition, 2 sub-pixel pairs RP in adjacent rows are located in adjacent columns of the pixel unit; 2 sub-pixel pairs BP in adjacent rows are located in adjacent columns of the pixel unit; 2 sub-pixel pairs GP in adjacent rows are located in adjacent columns of the pixel unit; and two opposite sides of the sub-pixel pair GP are respectively adjacent to the sub-pixel pair RP and the sub-pixel pair BP. More specifically, a first row of the pixel unit 310 may be in an arrangement form of RRGGBB from left to right; a second row of the pixel unit 310 may be in an arrangement form of GGBBRR from left to right, and a third row of the pixel unit 310 may be in an arrangement form of BBRRGG (arrangement 4).

Referring to FIG. 3B to 3C at the same time, in the fifth implementation manner to the sixth implementation manner of the pixel unit of the present disclosure, the pixel unit is formed by 8 sub-pixels R, 8 sub-pixels B, and 8 sub-pixels G, which are arranged in a form of a 4×6 matrix, and the pixel unit comprises sub-pixels of three different colors in each row direction. The pixel unit comprises 4 first color sub-pixel pairs, 4 second color sub-pixel pairs, and 4 third color sub-pixel pairs, wherein each two sub-pixels of a same color are arranged adjacent to each other to form a sub-pixel pair, that is, two sub-pixels R arranged adjacent to each other is a sub-pixel pair RP, two sub-pixels G arranged adjacent to each other is a sub-pixel pair GP, and two sub-pixels B arranged adjacent to each other is a sub-pixel pair BP. In addition, 2 sub-pixel pairs RP in adjacent rows are located in different columns and different rows of the pixel unit 220; 2 sub-pixel pairs BP in adjacent rows are located in different columns and different rows of the pixel unit 220; 2 sub-pixel pairs GP in adjacent rows are located in different columns and different rows of the pixel unit 220; and two opposite sides of the sub-pixel pair GP are respectively adjacent to the sub-pixel pair RP and the sub-pixel pair BP.

Referring to FIG. 3B, a pixel unit 320 is formed by 24 sub-pixels, and comprises 4 sub-pixels R arranged along a same row and two adjacent columns to form a sub-pixel pair RP (that is, a form of a 1×2 matrix), 4 sub-pixels B arranged along a same row and two adjacent columns to form a sub-pixel pair BP, and 4 sub-pixels G arranged along a same row and two adjacent columns to form a sub-pixel pair GP. In addition, 2 sub-pixel pairs RP in adjacent rows are located in adjacent columns of the pixel unit 320; 2 sub-pixel pairs BP in adjacent rows are located in adjacent columns of the pixel unit 220; 2 sub-pixel pairs GP in adjacent rows are located in adjacent columns of the pixel unit 320; and two opposite sides of the sub-pixel pair GP are respectively adjacent to the sub-pixel pair RP and the sub-pixel pair BP. More specifically, a first row of the pixel unit 320 may be in an arrangement form of RRGGBB from left to right; a second row of the pixel unit 320 may be in an arrangement form of BBRRGG from left to right; a third row of the pixel unit 320 may be in an arrangement form of GGBBRR; and a fourth row of the pixel unit 320 may be in an arrangement form of BBRRGG (arrangement 5).

Referring to FIG. 3C, a pixel unit 330 is approximately similar to the pixel unit 320, and is formed by 24 sub-pixels. The pixel unit 330 comprises 4 sub-pixels R arranged along a same row and two adjacent columns to form a sub-pixel pair RP (that is, a form of a 1×2 matrix), 4 sub-pixels B arranged along a same row and two adjacent columns to form a sub-pixel pair BP, and 4 sub-pixels G arranged along a same row and two adjacent columns to form a sub-pixel pair GP. In addition, 2 sub-pixel pairs RP in adjacent rows are located in adjacent columns of the pixel unit 330; 2 sub-pixel pairs BP in adjacent rows are located in adjacent columns of the pixel unit 330; 2 sub-pixel pairs GP in adjacent rows are located in adjacent columns of the pixel unit 330; and two opposite sides of the sub-pixel pair GP are respectively adjacent to the sub-pixel pair RP and the sub-pixel pair BP. More specifically, a first row of the pixel unit 330 may be in an arrangement form of RRGGBB from left to right; a second row of the pixel unit 330 may be in an arrangement form of GGBBRR from left to right; a third row of the pixel unit 330 may be in an arrangement form of BBRRGG; and a fourth row of the pixel unit 330 may be in an arrangement form of GGBBRR (arrangement 6).

FIG. 4A to 4E are schematic top views of a seventh implementation manner to an eleventh implementation manner of a pixel unit of the present disclosure, and the implementation manners relate to a pixel unit having multi-primary color display.

Referring to FIG. 4A to 4E at the same time, in the seventh implementation manner to the eleventh implementation manner of the pixel unit of the present disclosure, the pixel unit is formed by 4 sub-pixels R, 4 sub-pixels B, 4 sub-pixels G, and 4 sub-pixels W, which are arranged in a form of a matrix with 2 rows and 8 columns (2×8), and the pixel unit comprises sub-pixels of four different colors in each row direction; and sub-pixels of two colors are arranged adjacent to each other in a same column, and sub-pixels of the other two colors are arranged non-adjacent to each other in a same column. The pixel unit comprises 2 first color sub-pixel pairs, 2 second color sub-pixel pairs, and 2 third color sub-pixel pairs, wherein each two sub-pixels of a same color are arranged adjacent to each other to form a sub-pixel pair, that is, two sub-pixels R arranged adjacent to each other is a sub-pixel pair RP, two sub-pixels G arranged adjacent to each other is a sub-pixel pair GP, two sub-pixels B arranged adjacent to each other is a sub-pixel pair BP, and two sub-pixels W arranged adjacent to each other is a sub-pixel pair WP. Specific implementation manners of a pixel unit 410 to a pixel unit 450 are separately described below.

Figure 4A:
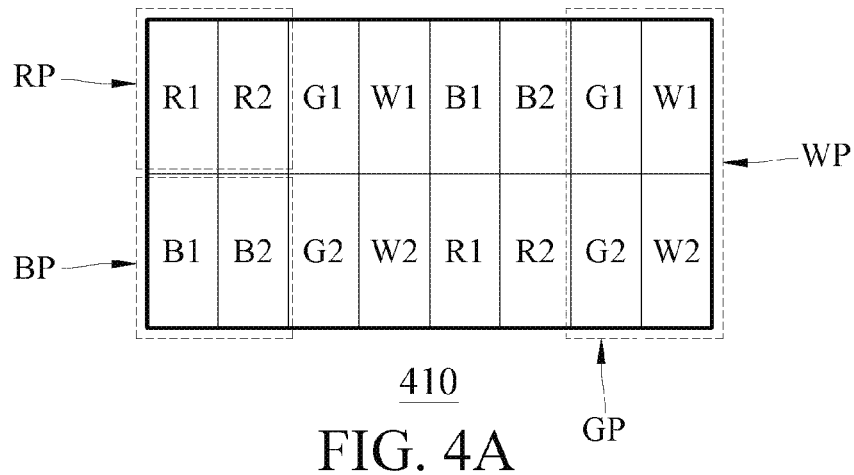
FIG. 4A is a schematic top view of a seventh implementation manner of a pixel unit of the present disclosure.

Referring to FIG. 4A, the pixel unit 410 is formed by 16 sub-pixels; the pixel unit 410 comprises 2 sub-pixels R arranged along a same row and two adjacent columns to form a sub-pixel pair RP (that is, a form of a 1×2 matrix), 2 sub-pixels B arranged along a same row and two adjacent columns to form a sub-pixel pair BP, 2 sub-pixels G arranged along a same column and two adjacent rows to form a sub-pixel pair GP (that is, a form of a 2×1 matrix), and 2 sub-pixels W arranged along a same column and two adjacent rows to form a sub-pixel pair WP. 2 sub-pixel pairs RP are separately located in different columns and different rows of the pixel unit 410; 2 sub-pixel pairs BP are separately located in different columns and different rows of the pixel unit 410; a sub-pixel pair RP and a sub-pixel pair BP are provided in adjacent rows and a same column of the pixel unit 410; 2 sub-pixel pairs GP are separately located in a same row and different columns of the pixel unit 410; 2 sub-pixel pairs WP are separately located in a same row and different columns of the pixel unit 410; the 2 sub-pixel pairs GP in the pixel unit 410 are arranged in non-adjacent columns and the 2 sub-pixel pairs WP are arranged in non-adjacent columns; and the sub-pixel pair GP in a same row and the sub-pixel pair WP in a same row are located in adjacent columns. More specifically, one row of the pixel unit 410 may be in an arrangement form of RRGWBBGW from left to right, and the other row of the pixel unit 410 may be in an arrangement form of BBGWRRGW from left to right (arrangement 7).

Referring to FIG. 4B to 4E, a pixel unit 420 to a pixel unit 450 all comprise 2 sub-pixels R arranged along a same row and two adjacent columns to form a sub-pixel pair RP (that is, a form of a 1×2 matrix), 2 sub-pixels B arranged along a same row and two adjacent columns to form a sub-pixel pair BP, 2 sub-pixels G arranged along a same row and two adjacent columns to form a sub-pixel pair GP, and 2 sub-pixels W arranged along a same row and two adjacent columns to form a sub-pixel pair WP.

Figure 4B:
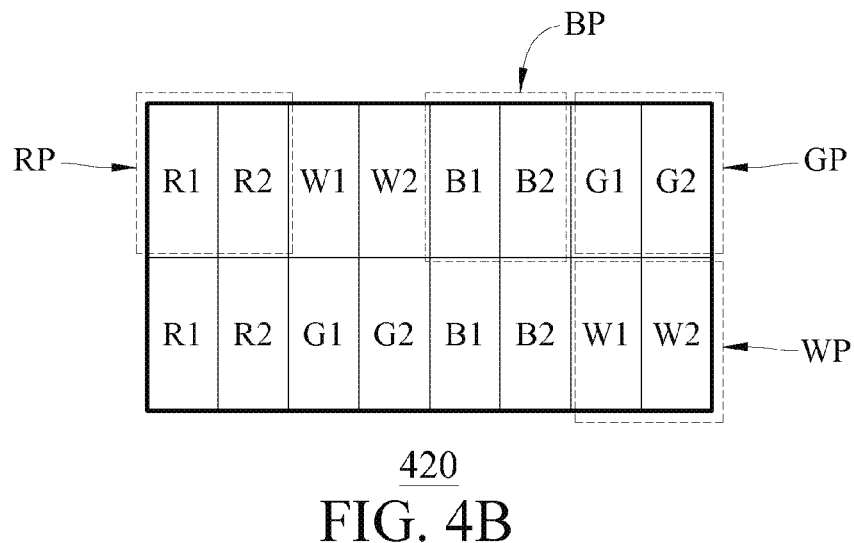
FIG. 4B is a schematic top view of an eighth implementation manner of a pixel unit of the present disclosure.

Referring to FIG. 4B, the pixel unit 420 is approximately similar to the pixel unit 410, and the difference lies in that sub-pixels of the sub-pixel pair GP and the sub-pixel pair WP are arranged along a same row and adjacent columns (that is, a form of a 1×2 matrix). In detail, the 2 sub-pixel pairs RP are respectively located in different columns and different rows of the pixel unit 420; the 2 sub-pixel pairs BP are respectively located in different columns and different rows of the pixel unit 420; the 2 sub-pixel pairs GP are respectively located in different columns and different rows of the pixel unit 420; and the 2 sub-pixel pairs WP are respectively located in different columns and different rows of the pixel unit 420. The sub-pixel pair GP and the sub-pixel pair WP in a same column are arranged in adjacent rows; and the sub-pixel pair BP and the sub-pixel pair RP in a same column are arranged in adjacent rows. The sub-pixel pair BP has two opposite sides in a row direction, which are separately provided with the sub-pixel pair GP and the sub-pixel pair WP; and the sub-pixel pair RP has two opposite sides in a row direction, which are separately provided with the sub-pixel pair GP and the sub-pixel pair WP. More specifically, one row of the pixel unit 420 may be in an arrangement form of RRGGBBWW from left to right, and the other row of the pixel unit 420 may be in an arrangement form of BBRRGG from left to right (arrangement 8).

Figure 4C:
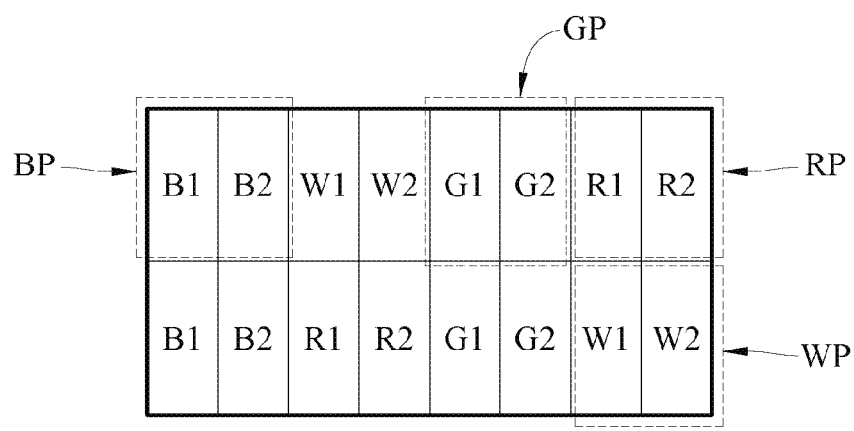
FIG. 4C is a schematic top view of a ninth implementation manner of a pixel unit of the present disclosure.

Referring to FIG. 4C, a pixel unit 430 is formed by 2 sub-pixel pairs RP, 2 sub-pixel pairs GP, 2 sub-pixel pairs BP, and 2 sub-pixel pairs WP, 16 sub-pixels in total, which are arranged in a form of a matrix with 2 rows and 8 columns. The 2 sub-pixel pairs BP are located in adjacent rows and a same column; the 2 sub-pixel pairs GP are located in adjacent rows and a same column; the 2 sub-pixel pairs RP are located in different columns and different rows of the pixel unit 430; the 2 sub-pixel pairs WP are located in different columns and different rows of the pixel unit 430; and the sub-pixel pair RP and the sub-pixel pair WP in a same column are arranged in adjacent rows. The sub-pixel pair BP has two opposite sides in a same row, which are separately provided with the sub-pixel pair RP and the sub-pixel pair WP; and the sub-pixel pair GP has two opposite sides in a same row, which are separately provided with the sub-pixel pair RP and the sub-pixel pair WP. More specifically, first and second columns of each row of the pixel unit 430 may be sub-pixels B, and fifth and sixth columns may be sub-pixels G. One row of the pixel unit 430 may be in an arrangement form of BBWWGGRR from left to right, and the other row of the pixel unit 430 may be in an arrangement form of BBRRGGWW from left to right (arrangement 9).

Figure 4D:
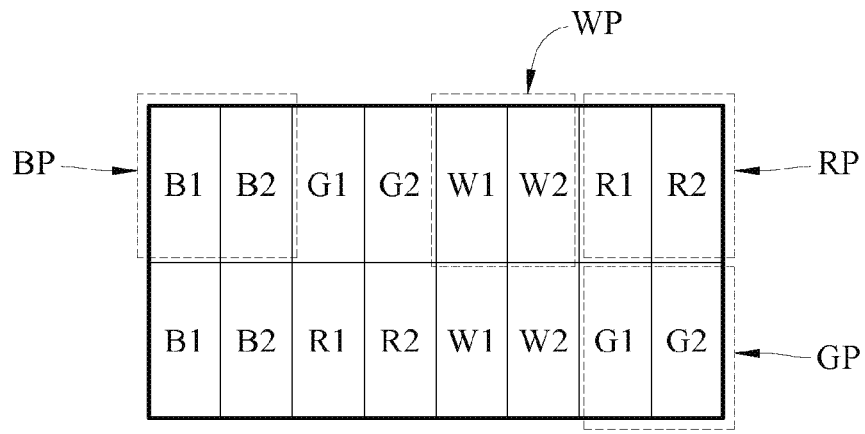
FIG. 4D is a schematic top view of a tenth implementation manner of a pixel unit of the present disclosure.

Referring to FIG. 4D, a pixel unit 440 is approximately similar to the pixel unit 430, and also has sub-pixel pairs of two colors that are separately located in a same column. The difference lies in that in the pixel unit 440, sub-pixel pairs BP and sub-pixel pairs WP are separately located in a same column, that is, first and second columns of each row of the pixel unit 440 may be sub-pixels B, and fifth and sixth columns may be sub-pixels W. The 2 sub-pixel pairs GP are separately located in different columns and different rows of the pixel unit 440; the 2 sub-pixel pairs RP are separately located in different columns and different rows of the pixel unit 440; and the sub-pixel pair RP and the sub-pixel pair GP in a same column are arranged in adjacent rows. The sub-pixel pair BP has two opposite sides in a same row, which are separately provided with the sub-pixel pair GP and the sub-pixel pair RP; and the sub-pixel pair WP has two opposite sides in a same row, which are separately provided with the sub-pixel pair GP and the sub-pixel pair RP. More specifically, one row of the pixel unit 440 may be in an arrangement form of BBGGWWRR from left to right, and the other row of the pixel unit 440 may be in an arrangement form of BBRRWWGG from left to right (arrangement 10).

Figure 4E:
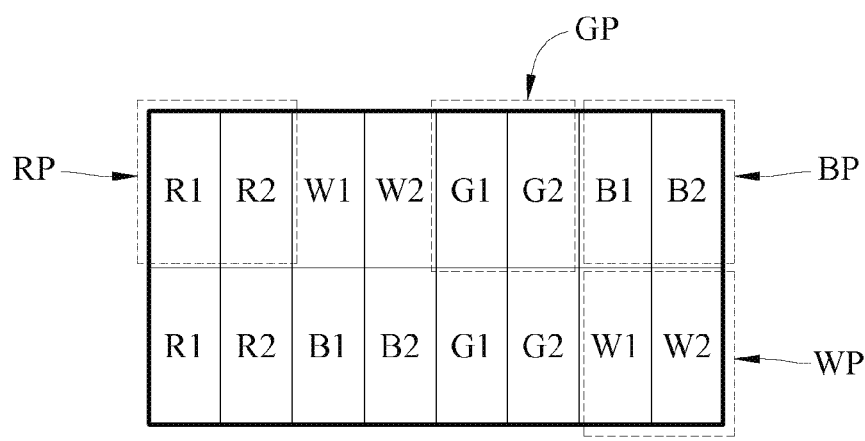
FIG. 4E is a schematic top view of an eleventh implementation manner of a pixel unit of the present disclosure.

Referring to FIG. 4E, a pixel unit 450 is approximately similar to the pixel units 430 and 440, and also has sub-pixel pairs of two colors that are separately located in a same column. The difference lies in that in the pixel unit 450, sub-pixel pairs RP and sub-pixel pairs GP are separately located in a same column, that is, first and second columns of each row of the pixel unit 450 may be sub-pixels R, and fifth and sixth columns may be sub-pixels G. The 2 sub-pixel pairs WP are separately located in different columns and different rows of the pixel unit 450; the 2 sub-pixel pairs BP are separately located in different columns and different rows of the pixel unit 450; and the sub-pixel pair WP and the sub-pixel pair BP in a same column are arranged in adjacent rows. The sub-pixel pair RP has two opposite sides in a same row, which are separately provided with the sub-pixel pair WP and the sub-pixel pair BP; and the sub-pixel pair GP has two opposite sides in a same row, which are separately provided with the sub-pixel pair WP and the sub-pixel pair BP. More specifically, one row of the pixel unit 450 may be in an arrangement form of RRWWGGBB from left to right, and another row of the pixel unit 450 may be in an arrangement form of RRBBGGWW from left to right (arrangement 11).

FIG. 5A to 5D are schematic top views of a twelfth implementation manner to a fifteenth implementation manner of a pixel unit of the present disclosure, and the implementation manners relate to a pixel unit having multi-primary color display.

Referring to FIG. 5A to 5D at the same time, in the twelfth implementation manner to the fifteenth implementation manner of the pixel unit of the present disclosure, the pixel unit is formed by 4 sub-pixels R, 4 sub-pixels B, 4 sub-pixels G, and 4 sub-pixels W, which are arranged in a form of a matrix with 2 rows and 8 columns (2×8), and the pixel unit comprises sub-pixels of four different colors in each row direction, and sub-pixels of a same color are arranged non-adjacent to each other in a same column. The pixel unit comprises 2 first color sub-pixel pairs, 2 second color sub-pixel pairs, and 2 third color sub-pixel pairs, wherein each two sub-pixels of a same color are arranged adjacent to each other in a same row to form a sub-pixel pair, that is, two sub-pixels R arranged adjacent to each other in a same row is a sub-pixel pair RP, two sub-pixels G arranged adjacent to each other in a same row is a sub-pixel pair GP, two sub-pixels B arranged adjacent to each other in a same row is a sub-pixel pair BP, and two sub-pixels W arranged adjacent to each other in a same row is a sub-pixel pair WP. Specific implementation manners of a pixel unit 510 to a pixel unit 540 are separately described below.

Figure 5A:
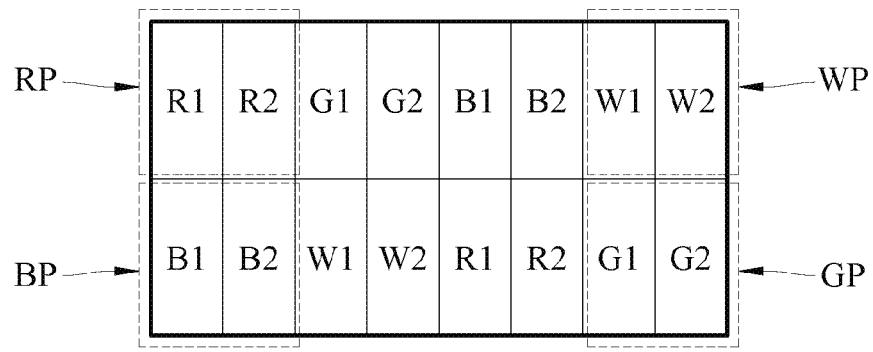
FIG. 5A is a schematic top view of a twelfth implementation manner of a pixel unit of the present disclosure.

Referring to FIG. 5A, the pixel unit 510 is formed by 16 sub-pixels; the pixel unit 510 comprises 2 sub-pixels R arranged along a same row and two adjacent columns to form a sub-pixel pair RP (that is, a form of a 1×2 matrix), 2 sub-pixels G arranged along a same row and two adjacent columns to form a sub-pixel pair GP, 2 sub-pixels B arranged along a same row and two adjacent columns to form a sub-pixel pair BP, and 2 sub-pixels W arranged along a same row and two adjacent columns to form a sub-pixel pair WP. The 2 sub-pixel pairs RP are respectively located in different columns and different rows of the pixel unit 510; the 2 sub-pixel pairs GP are respectively located in different columns and different rows of the pixel unit 510; the 2 sub-pixel pairs BP are respectively located in different columns and different rows of the pixel unit 510; and the 2 sub-pixel pairs WP are respectively located in different columns and different rows of the pixel unit 510. In addition, sub-pixel pairs of four colors in adjacent rows are arranged in a cyclic queue manner; a first row of the pixel unit 510 is a sub-pixel pair RP, a sub-pixel pair GP, a sub-pixel pair BP, and a sub-pixel pair WP from left to right in sequence; and sub-pixel pairs of two colors are shifted in a second row, and the second row is arranged starting from a sub-pixel pair BP, and is the sub-pixel pair BP, a sub-pixel pair WP, a sub-pixel pair RP, and a sub-pixel pair GP from left to right in sequence. More specifically, one row of the pixel unit 510 may be in an arrangement form of RRGGBBWW from left to right, and the other row of the pixel unit 510 may be in an arrangement form of BBWWRRGG from left to right (arrangement 12).

Figure 5B:
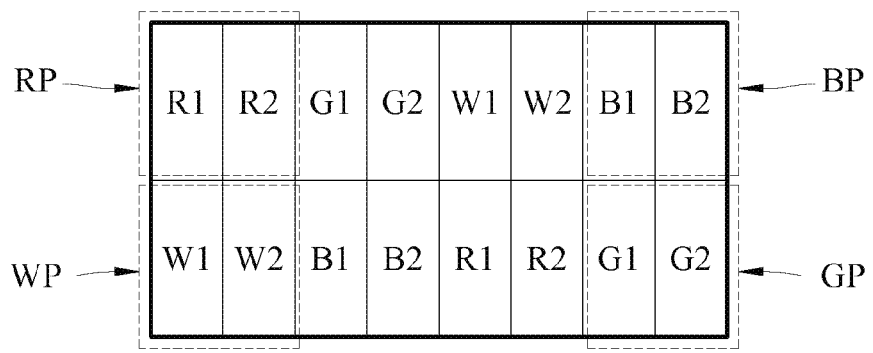
FIG. 5B is a schematic top view of a thirteenth implementation manner of a pixel unit of the present disclosure.

Referring to FIG. 5B, a pixel unit 520 is approximately similar to the pixel unit 510, and the difference lies in that, in the pixel unit 520, a first row is a sub-pixel pair RP, a sub-pixel pair GP, a sub-pixel pair WP, and a sub-pixel pair BP from left to right in sequence, and sub-pixel pairs of two colors are shifted in a second row, and the second row is arranged starting from a sub-pixel pair WP, and is the sub-pixel pair WP, a sub-pixel pair BP, a sub-pixel pair RP, and a sub-pixel pair GP from left to right in sequence. More specifically, one row of the pixel unit 520 may be in an arrangement form of RRGGWWBB from left to right, and the other row of the pixel unit 520 may be in an arrangement form of WWBBRRGG from left to right (arrangement 13).

Figure 5C:
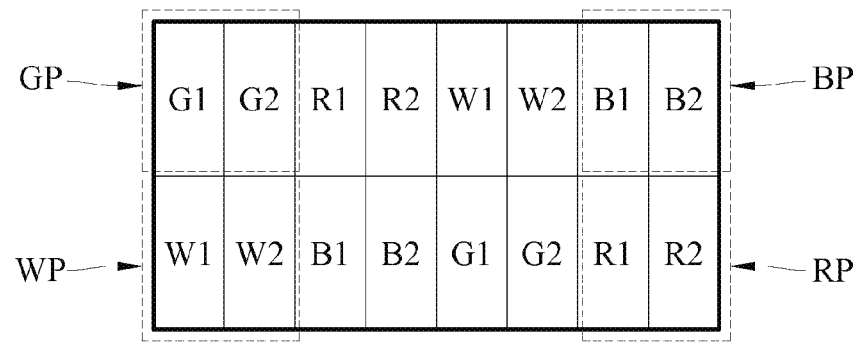
FIG. 5C is a schematic top view of a fourteenth implementation manner of a pixel unit of the present disclosure.

Referring to FIG. 5C, a pixel unit 530 is approximately similar to the pixel unit 510, and the difference lies in that, in the pixel unit 530, a first row is a sub-pixel pair GP, a sub-pixel pair RP, a sub-pixel pair WP, and a sub-pixel pair BP from left to right in sequence, and sub-pixel pairs of two colors are shifted in a second row, and the second row is arranged starting from a sub-pixel pair WP, and is the sub-pixel pair WP, a sub-pixel pair BP, a sub-pixel pair GP, and a sub-pixel pair RP from left to right in sequence. More specifically, one row of the pixel unit 530 may be in an arrangement form of GGRRWWBB from left to right, and the other row of the pixel unit 530 may be in an arrangement form of WWBBGGRR from left to right (arrangement 14).

Figure 5D:
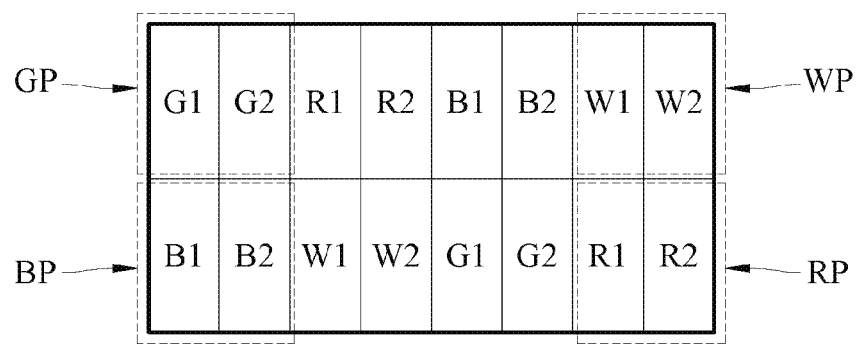
FIG. 5D is a schematic top view of a fifteenth implementation manner of a pixel unit of the present disclosure.

Referring to FIG. 5D, a pixel unit 540 is approximately similar to the pixel unit 510, and the difference lies in that, in the pixel unit 540, a first row is a sub-pixel pair RP, a sub-pixel pair GP, a sub-pixel pair BP, and a sub-pixel pair WP from left to right in sequence, and sub-pixel pairs of two colors are shifted in a second row, and the second row is arranged starting from a sub-pixel pair BP, and is the sub-pixel pair BP, a sub-pixel pair WP, a sub-pixel pair RP, and a sub-pixel pair GP from left to right in sequence. More specifically, one row of the pixel unit 520 may be in an arrangement form of RRGGWWBB from left to right, and the other row of the pixel unit 520 may be in an arrangement form of WWBBRRGG from left to right (arrangement 15).

Figure 6:
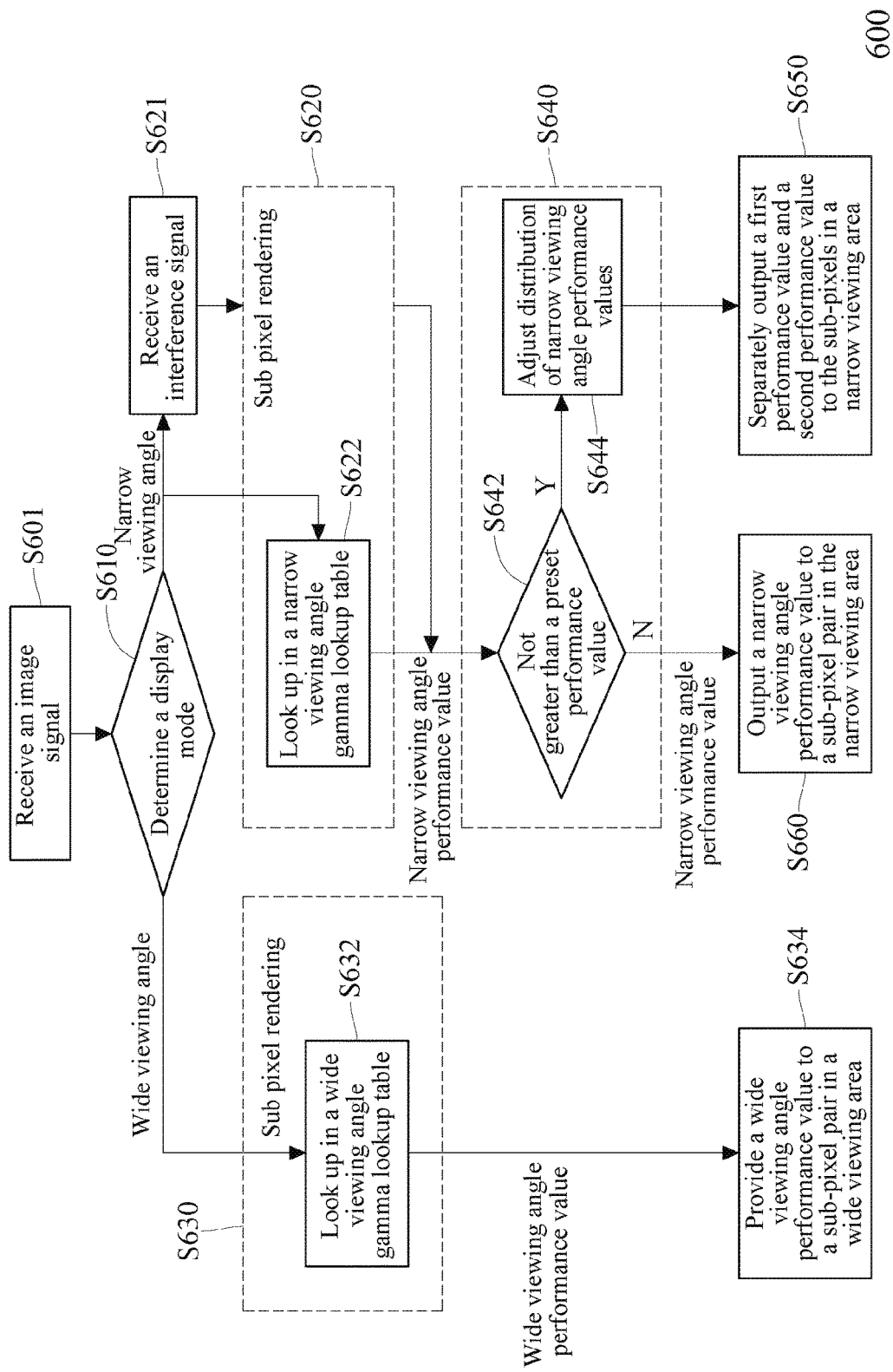
FIG. 6 is a flowchart of a display method applied to an implementation manner of the present disclosure.

FIG. 6 is a flowchart of a display method applied to an implementation manner of the present disclosure. Referring to FIG. 6 in cooperation with FIG. 1, an input unit 120 in a display apparatus is configured to receive an image signal. An SPR unit 130 in the display apparatus 100 is configured to perform sub pixel rendering according to the image signal received by the input unit 120, so that sub-pixels (that is, sub-pixels R, sub-pixels B, sub-pixels G, and sub-pixels W) of a corresponding pixel unit in a display panel 110 generate performance values. A method for performing sub pixel rendering on an image signal is described by using that the sub-pixels are sub-pixels R as an example. First, an output range of image data is determined, wherein the output range may comprise an area formed by a sub-pixel R or other sub-pixels R adjacent to the sub-pixel R; then, a corresponding transform matrix is found, and the image signal is transformed according to the transform matrix, into performance values of sub-pixels R corresponding to the output range. The transform matrix may be a matrix that transforms the image signal from original color sub-pixel arrangement into specific color sub-pixel arrangement.

The present disclosure further discloses a display method that can match a display apparatus having the foregoing pixel unit; under a peep-proof display effect, the display apparatus 100 can display an image only in a specific viewing angle range, called a narrow viewing angle display mode below; under a normal display effect, the display apparatus 100 can display an image in a wide viewing angle range, called a wide viewing angle display mode below. The present disclosure discloses a display method having a peep-proof function, comprising: in the narrow viewing angle display mode, when a narrow viewing angle performance value is not greater than a preset performance value, the narrow viewing angle performance value is adjusted to make two sub-pixels of a sub-pixel pair display different performance values; and when the narrow viewing angle performance value is greater than the preset performance value, the two sub-pixels in the sub-pixel pair may display a same performance value; and in the wide viewing angle display mode, the two sub-pixels in the sub-pixel pair may display a same performance value. A display method for the display apparatus 100 having a peep-proof function disclosed in the present disclosure is described below, wherein the display method 600 comprises:

S601: receive an image signal to an input unit;

S610: determine a display mode of a display apparatus;

when the display apparatus is in a narrow viewing angle display mode, the method comprises:

S621: receive an interference pattern to the input unit, wherein the interference pattern comprises a dark zone and a bright zone;

S620: the bright zone generates a narrow viewing angle performance value according to the image signal and a narrow viewing angle gamma lookup table;

S640: when the narrow viewing angle performance value is not greater than a preset performance value TH, the SPR unit adjusts the narrow viewing angle performance value as a first performance value and a second performance value;

S650: when the narrow viewing angle performance value is not greater than the preset performance value TH, output the first performance value and the second performance value to a sub-pixel pair in the bright zone; and S660: when the narrow viewing angle performance value is greater than the preset performance value TH, output the narrow viewing angle performance value to the sub-pixel pair in the bright zone.

Figure 7:
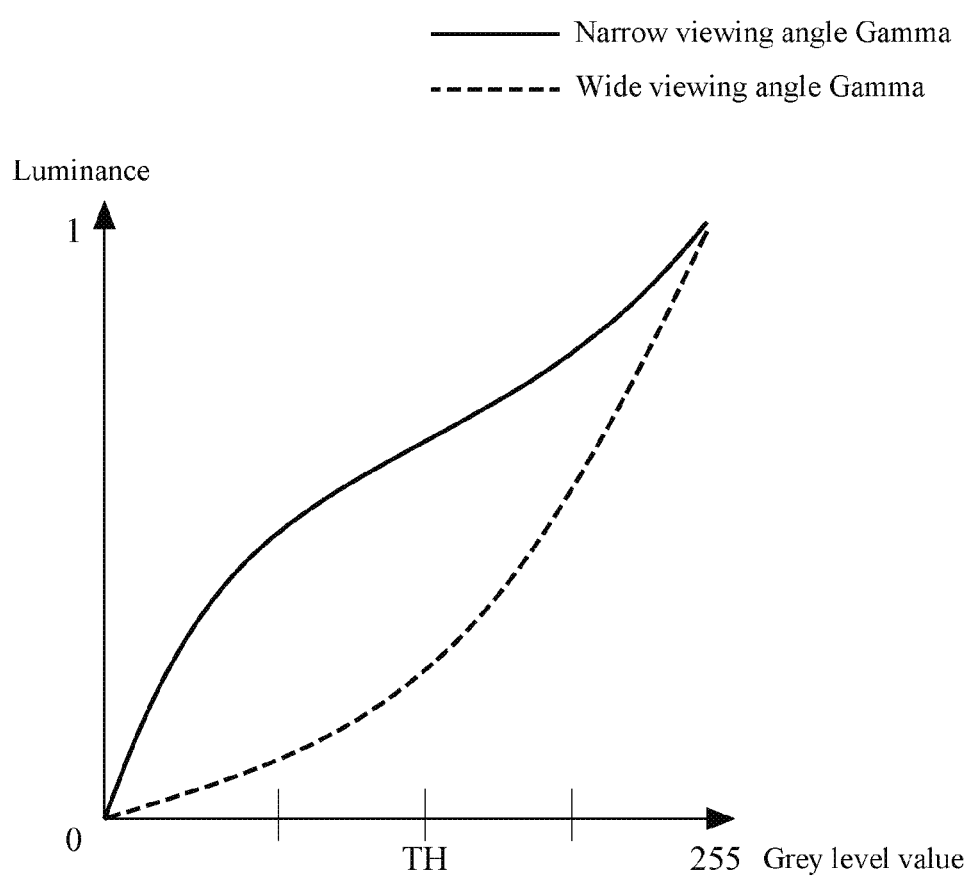
FIG. 7 is a gamma curve schematic diagram of a wide viewing angle display mode and a narrow viewing angle display mode of an implementation manner of the present disclosure.

FIG. 7 is a gamma curve schematic diagram of a wide viewing angle display mode and a narrow viewing angle display mode of an implementation manner of the present disclosure.

Figure 8A:
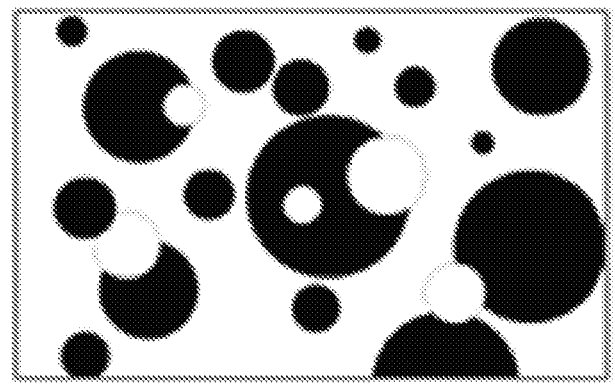
FIG. 8A is an interference pattern of a display method of an implementation manner of the present disclosure.
Figure 8B:
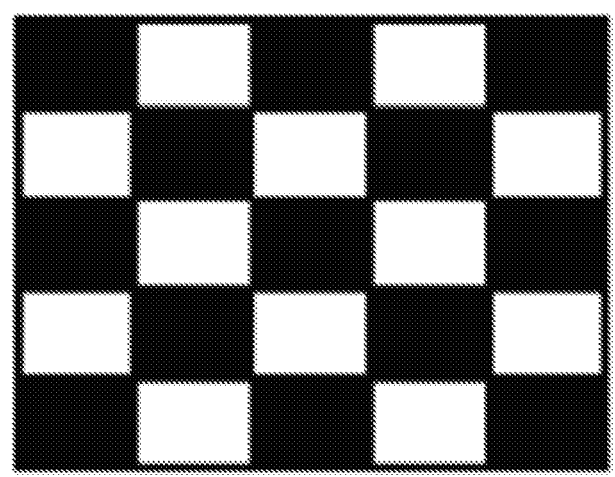
FIG. 8B is an interference pattern of a display method applied to another implementation manner of the present disclosure.

FIGS. 8A and 8B are interference patterns of a display method applied to an implementation manner of the present disclosure. Refer to FIG. 6 to FIG. 8 at the same time for reference.

The display method 600 comprises the following steps: step S601: the input unit 120 receives an image signal to the display apparatus 100; step S610: determine whether a display mode of the display apparatus 100 is a wide viewing angle display mode or a narrow viewing angle display mode; when the display apparatus wants to display the narrow viewing angle display mode, the image signal may adjust color gamut performance of the image signal according to a narrow viewing angle gamma curve of a narrow viewing angle gamma lookup table stored in the display apparatus 100. As shown in FIG. 7, the gamma curve may be a value curve obtained by corresponding normalized luminance to grey level values. As shown in FIG. 7, the narrow viewing angle gamma curve generally may be a convex curve, which represents that change trends of luminance on low grey level are fierce, and change trends of luminance on high grey level are mitigatory. A wide viewing angle gamma curve generally may be a concave curve, which represents that change trends of luminance on low grey level are mitigatory, and change trends of luminance on high grey level are fierce. When the display apparatus 100 wants to display the narrow viewing angle display mode, step S621 is performed: the input unit 120 receives an interference pattern, which may be a black and white image shown in FIGS. 8A and 8B, and is an image that has same chroma and different luminances and is received by a user in a side view range; that is, the interference pattern may be divided into a dark zone and a bright zone; the dark zone refers to an area with a low performance value, especially an area with grey level of 0, and the bright zone refers to an area with a high performance value, especially an area with grey level of 255. Step S620: the bright zone generates a narrow viewing angle performance value according to the image signal and the narrow viewing angle gamma lookup table; the image signal is transmitted to the SPR unit 130 by the input unit 120, and then the SPR unit 130 determines the narrow viewing angle gamma curve according to the image signal and the narrow viewing angle gamma lookup table, and then the SPR unit enables the image signal to generate corresponding performance values according to a pixel unit arrangement manner of the display panel 110. Step S640: when the narrow viewing angle performance value in the bright zone is not greater than the preset performance value TH, the SPR unit adjusts the narrow viewing angle performance value as a first performance value and a second performance value; when the SPR unit 130 determines that the narrow viewing angle performance value is not greater than the preset performance value TH, the SRP unit 130 performs a luminance adjusting function, namely, adjusts the narrow viewing angle performance value.

When the display apparatus is in the narrow viewing angle display mode, the display method 600 further comprises steps:

S642: determine whether the narrow viewing angle performance value is not greater than the preset performance value TH, wherein the preset performance value TH is related to a wide viewing angle gamma lookup table; and S644: when the narrow viewing angle performance value is not greater than the preset performance value TH, the SPR unit adjusts the narrow viewing angle performance value as a performance value LA and a performance value LC.

In the narrow viewing angle display mode, the SPR unit further executes step S642: determine whether a narrow viewing angle signal is less than the preset performance value TH, wherein the preset performance value TH is related to the wide viewing angle gamma lookup table. For example, when the narrow viewing angle performance value LB output in step S620 is not greater than the preset performance value TH, the narrow viewing angle performance value output to a pixel pair of the display panel 110 is adjusted; the preset performance value TH may be, for example, a half tone image of the wide viewing angle gamma curve, and is generally called a tone value. For example, a tone value of grey level 255 may be grey level 186. However, the preset performance value TH may also be designed according to actual design requirements. Step S644: when the narrow viewing angle signal is less than the preset performance value TH, the SPR unit 130 adjusts the narrow viewing angle performance value LB according to first weight to obtain a performance value LA, wherein the first weight is less than 1, and adjusts the performance value LC according to a performance value obtained by adjusting the narrow viewing angle performance value LB according to the second weight, wherein the second weight is greater than 1. For example, the first weight may be 0, and the second weight may be twice. Step S650: output the performance value LA and the performance LC to a sub-pixel pair of a narrow viewing area. Step S660; when the narrow viewing angle performance value is greater than the preset performance value, output the narrow viewing angle performance value LB to a sub-pixel pair of the bright zone.

Figure 9:
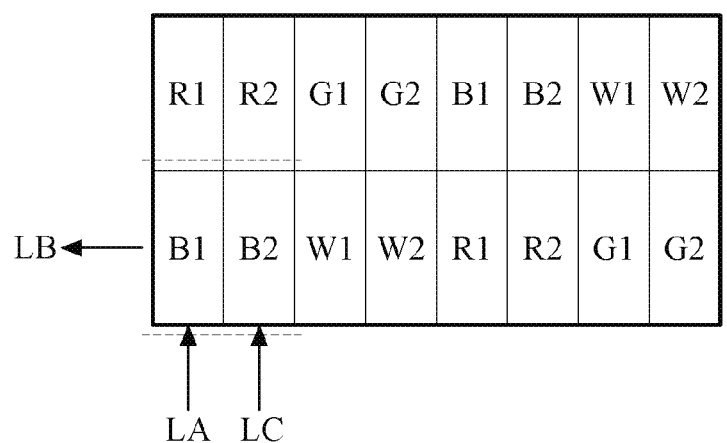
FIG. 9 is a schematic diagram of a performance value of a pixel unit 510 applied to an implementation manner of the present disclosure.

Referring to FIG. 9, FIG. 9 is a schematic diagram of a performance value of a pixel unit 510 of an embodiment disclosed in the present disclosure. Refer to the flowchart of FIG. 6 in cooperation with the pixel unit 510. By using the sub-pixel pair BP in the pixel unit 510 as an example, the sub-pixel pair BP has a sub-pixel B1 and a sub-pixel B2; when the narrow viewing angle performance value LB output in step S620 is less than grey level 186, step S644 is entered to adjust performance values output to the sub-pixel pair BP, wherein a performance value of the sub-pixel B1 may be adjusted according to a first weight, so that a performance value LA output to the sub-pixel B1 is less than the original narrow viewing angle performance value LB; a performance value of the sub-pixel B2 may be adjusted according to a second weight, so that the performance value LC output to the sub-pixel B2 is greater than the original narrow viewing angle performance value LB. The performance values LA, LB, and LC are used to represent values of performance values.

The display method 600 further comprises: when the display apparatus is in the wide viewing angle display mode, S630: generate a wide viewing angle performance value according to an image signal and a wide viewing angle gamma lookup table; and S634: output the wide viewing angle performance value to a sub-pixel pair of the pixel unit.

Referring to FIG. 9, FIG. 9 is a pixel unit 510 of an embodiment disclosed in the present disclosure. Refer to the flowchart of FIG. 6 in cooperation with the pixel unit 510. Step S630: generate a wide viewing angle performance value according to an image signal and a wide viewing angle gamma lookup table; by using an implementation manner disclosed in the present disclosure as an example, the image signal is transformed from a signal domain to a luminance domain by means of gamma transformation, so that the image signal corresponds to a corresponding performance value to facilitate executing, by the SPR unit 130, sub pixel rendering; and step S634: output the wide viewing angle performance value generated after the SRP unit 130 executes sub pixel rendering to a sub-pixel B1 and a sub-pixel B2 of the sub-pixel pair BP, that is, in the wide viewing angle display mode, performance values received by the sub-pixel B1 and the sub-pixel B2 in the sub-pixel pair BP may be the same.

In the wide viewing angle display mode, the sub-pixel B1 and the sub-pixel B2 can both be used to display a wide viewing angle image; when a performance value corresponding a wide viewing angle performance value, according to the wide viewing angle gamma lookup table, of the received image signal is LB, the sub-pixel B1 and the sub-pixel B2 of the sub-pixel pair BP can display a performance value having grey level LB. Because the sub-pixel B1 and the sub-pixel B2 of the sub-pixel pair BP both display a same performance value, in the wide viewing angle display mode, performance values of the sub-pixel pair BP achieve an effect of luminance additivity, by means of the pixel arrangement and display method therefor disclosed in the present disclosure, display quality of the display apparatus 100 may be improved in a case in which ambient luminance is the same.

In the narrow viewing angle display mode, when the narrow viewing angle performance value LB in the bright zone is not greater than the preset performance value TH, the SPR unit 130 performs luminance adjustment on the sub-pixel pair BP to readjust luminance of the sub-pixel B1 and the sub-pixel B2 of the sub-pixel pair BP, so that the adjusted sub-pixel B1 and sub-pixel B2 respectively have the performance value LA and the performance value LC, and LA<LB<LC. In other words, in the sub-pixel pair BP upon which luminance adjustment is performed, only one sub-pixel provides a performance value to the display panel 110. Therefore, the narrow viewing angle performance value LA of the sub-pixel P1 may be 0, and the interference performance value LC of the sub-pixel P2 may be 2LB. That is, the performance value of the sub-pixel B1 is reduced in the bright zone, and the performance value of the sub-pixel B2 is improved in the bright zone. Therefore, by means of the pixel arrangement and display method therefor disclosed in the present disclosure, the effect of narrow viewing angle display can be achieved without adding an optical film, so as to increase universality of the display apparatus 100, and reduce costs and thickness of a peep-proof display apparatus.

The present disclosure discloses a display method. In a wide viewing angle display mode, two sub-pixels in a sub-pixel pair present a same performance value to achieve the effect of improving display quality; in a narrow viewing angle display mode, performance values of a sub-pixel pair of a bright zone in an interference pattern are adjusted to achieve the effect of peep-proof display.

The present disclosure further discloses a pixel matrix that can apply a display method of the present disclosure, wherein the pixel matrix comprises a plurality of pixel unit arrangement manners, and each pixel unit comprises at least 12 sub-pixels, and each two of sub-pixels of a same color may also be arranged adjacent to each other to form at least 2 sub-pixel pairs. The effect of peep-proof display is achieved by means of displaying, by two sub-pixels in a sub-pixel pair, different performance values.

Based on the above, the present disclosure provides a pixel matrix and a display method that applies the pixel matrix, so that a display apparatus has wide viewing angle display and narrow viewing angle display functions. Therefore, by means of the pixel arrangement and display method therefor disclosed in the present disclosure, the effect of narrow viewing angle display can be achieved without adding an optical film, so as to increase universality of the display apparatus, and reduce costs and thickness of a peep-proof display apparatus.

The present disclosure is disclosed through the foregoing implementation manners; however, these implementation manners are not intended to limit the present disclosure. Various changes and modifications made without departing from the spirit and scope of the present disclosure shall fall within the protection scope of the present disclosure. The protection scope of the present disclosure is subject to the appended claims.

What is claimed is:
1. A pixel matrix, comprising:
a plurality of pixel units, wherein each pixel unit comprises 12 sub-pixels arranged in matrix manner along a column direction and a row direction, and the column direction is not parallel to the row direction;
wherein the sub-pixels comprise:
two pairs of first color sub-pixels, two pairs of second color sub-pixels, and two pairs of third color sub-pixels;
wherein the first color, the second color, and the third color are different colors;
wherein the first color sub-pixels in each pair are arranged adjacent to each other, and the first color sub-pixel pairs are separately provided in different columns and different rows of the pixel unit;
wherein the second color sub-pixels in each pair are arranged adjacent to each other, and the second color sub-pixel pairs are separately provided in different columns and different rows of the pixel unit;
wherein each first color sub-pixel pair and each second color sub-pixel pair are arranged adjacent to each other in the column direction; and
wherein each pixel unit is one of matrix arrangements with 2 rows and 6 columns (2×6):
R R G B B G
B B G R R G (arrangement 1),
R R G G B B
B B R R G G (arrangement 2), and
R R G G B B
G G B B R R (arrangement 3).
2. A pixel matrix, comprising:
a plurality of pixel units, wherein each pixel unit comprises 18 sub-pixels arranged in matrix manner along a column direction and a row direction, and the column direction is not parallel to the row direction;
wherein the sub-pixels comprise:
three pairs of first color sub-pixels, three pairs of second color sub-pixels, and three pairs of third color sub-pixels;
wherein the first color, the second color, and the third color are different colors;
wherein the first color sub-pixels in each pair are arranged adjacent to each other, and the first color sub-pixel pairs are separately provided in different columns and different rows of the pixel unit;
wherein the second color sub-pixels in each pair are arranged adjacent to each other, and the second color sub-pixel pairs are separately provided in different columns and different rows of the pixel unit;
wherein the third color sub-pixels in each pair are arranged adjacent to each other, and the third color sub-pixel pairs are separately provided in different columns and different rows of the pixel unit;
wherein each first color sub-pixel pair and each second color sub-pixel pair are arranged adjacent to each other in the column direction; and
wherein each pixel unit is in a matrix arrangement with 3 rows and 6 columns (3×6):
R R G G B B
G G B B R R
B B R R G G (arrangement 4).
3. A pixel matrix, comprising:
a plurality of pixel units, wherein each pixel unit comprises 24 sub-pixels arranged in matrix manner along a column direction and a row direction, and the column direction is not parallel to the row direction;

wherein the 24 sub-pixels comprise:
four pairs of first color sub-pixels, four pairs of second color sub-pixels, and four pairs of third color sub-pixels;
wherein the first color, the second color, and the third color are different colors;
wherein the first color sub-pixels in each pair are arranged adjacent to each other, and the first color sub-pixel pairs in adjacent rows are separately provided in different columns of the pixel unit;
wherein the second color sub-pixels in each pair are arranged adjacent to each other, and the second color sub-pixel pairs in adjacent rows are separately provided in different columns of the pixel unit;
wherein the third color sub-pixels in each pair are arranged adjacent to each other, and the third color sub-pixel pairs in adjacent rows are separately provided in different columns of the pixel unit;
wherein each first color sub-pixel pair and each second color sub-pixel pair are arranged adjacent to each other in the column direction; and
wherein each pixel unit is one of matrix arrangements with 4 rows and 6 columns (4×6):
R R G G B B
B B R R G G
G G B B R R
B B R R G G (arrangement 5) and
R R G G B B
G G B B R R
B B R R G G
G G B B R R (arrangement 6).

4. A pixel matrix, comprising:
a plurality of pixel units, wherein each pixel unit comprises 16 sub-pixels arranged in matrix manner along a column direction and a row direction, and the column direction is not parallel to the row direction;
wherein the 16 sub-pixels comprise:
  4 first color sub-pixels, 4 second color sub-pixels, 4 third color sub-pixels, and 4 fourth color sub-pixels;
  wherein the first color, the second color, the third color, and the fourth color are different;
  wherein the first color sub-pixels in each pair are arranged adjacent to each other, and the first color sub-pixel pairs are separately provided in different columns and different rows of the pixel unit;
  wherein the second color sub-pixels in each pair are arranged adjacent to each other, and the second color sub-pixel pairs are separately provided in different columns and different rows of the pixel unit;
  wherein each first color sub-pixel pair and each second color sub-pixel pair are arranged adjacent to each other in the column direction;
  wherein each two of the first color sub-pixels are arranged adjacent to each other in a same row to form 2 first color sub-pixel pairs, and the first color sub-pixel pairs in adjacent rows are separately provided in different columns of the pixel unit;
  wherein each two of the second color sub-pixels are arranged adjacent to each other in a same row to form 2 second color sub-pixel pairs, and the second color sub-pixel pairs in adjacent rows are separately provided in different columns of the pixel unit;
  wherein each two of the third color sub-pixels are arranged adjacent to each other to form 2 third color sub-pixel pairs, and the third color sub-pixel pairs in adjacent rows are provided in a same column of the pixel unit; and
  wherein each two of the fourth color sub-pixels are arranged adjacent to each other to form 2 fourth color sub-pixel pairs, and the fourth color sub-pixel pairs in adjacent rows are provided in a same column of the pixel unit.

5. A pixel matrix, comprising:
a plurality of pixel units, wherein each pixel unit comprises 16 sub-pixels arranged in matrix manner along a column direction and a row direction, and the column direction is not parallel to the row direction;
wherein the 16 sub-pixels comprise:
  4 first color sub-pixels, 4 second color sub-pixels, 4 third color sub-pixels, and 4 fourth color sub-pixels;
  wherein the first color, the second color, the third color, and the fourth color are different;
  wherein the first color sub-pixels in each pair are arranged adjacent to each other, and the first color sub-pixel pairs are separately provided in different columns and different rows of the pixel unit;
  wherein the second color sub-pixels in each pair are arranged adjacent to each other, and the second color sub-pixel pairs are separately provided in different columns and different rows of the pixel unit;
  wherein each first color sub-pixel pair and each second color sub-pixel pair are arranged adjacent to each other in the column direction;
  wherein each pixel unit is one of the following matrix arrangements with 2 rows and 8 columns (2×8):
  R R G W B B G W
  B B G W R R G W (arrangement 7),
  R R G G B B W W
  B B W W R R G G (arrangement 8),
  B B W W G G R R
  B B R R G G W W (arrangement 9),
  B B G G W W R R
  B B R R W W G G (arrangement 10), and
  R R W W G G B B
  R R B B G G W W (arrangement 11).

6. A pixel matrix, comprising:
a plurality of pixel units, wherein each pixel unit comprises 16 sub-pixels arranged in matrix manner along a column direction and a row direction, and the column direction is not parallel to the row direction;
wherein the 16 sub-pixels comprise:
  4 first color sub-pixels, 4 second color sub-pixels, 4 third color sub-pixels, and 4 fourth color sub-pixels;
  wherein the first color, the second color, the third color, and the fourth color are different;
  wherein the first color sub-pixels in each pair are arranged adjacent to each other, and the first color sub-pixel pairs are separately provided in different columns and different rows of the pixel unit;
  wherein the second color sub-pixels in each pair are arranged adjacent to each other, and the second color sub-pixel pairs are separately provided in different columns and different rows of the pixel unit;
  wherein each first color sub-pixel pair and each second color sub-pixel pair are arranged adjacent to each other in the column direction;
  wherein each two of the first color sub-pixels are arranged adjacent to each other in a same row to form 2 first color sub-pixel pairs, and the first color sub-pixel pairs in adjacent rows are separately provided in different columns of the pixel unit;
  wherein each two of the second color sub-pixels are arranged adjacent to each other in a same row to form 2 second color sub-pixel pairs, and the second color sub-pixel pairs in adjacent rows are separately provided in different columns of the pixel unit;

wherein each two of the third color sub-pixels are arranged adjacent to each other in a same row to form 2 third color sub-pixel pairs, and the third color sub-pixel pairs in adjacent rows are separately provided in different columns of the pixel unit; and wherein each two of the fourth color sub-pixels are arranged adjacent to each other in a same row to form 2 fourth color sub-pixel pairs, and the fourth color sub-pixel pairs in adjacent rows are separately provided in different columns of the pixel unit.

7. A pixel matrix, comprising:

a plurality of pixel units, wherein each pixel unit comprises 16 sub-pixels arranged in matrix manner along a column direction and a row direction, and the column direction is not parallel to the row direction;

wherein the 16 sub-pixels comprise:
- 4 first color sub-pixels, 4 second color sub-pixels, 4 third color sub-pixels, and 4 fourth color sub-pixels;
- wherein the first color, the second color, the third color, and the fourth color are different;
- wherein the first color sub-pixels in each pair are arranged adjacent to each other, and the first color sub-pixel pairs are separately provided in different columns and different rows of the pixel unit;
- wherein the second color sub-pixels in each pair are arranged adjacent to each other, and the second color sub-pixel pairs are separately provided in different columns and different rows of the pixel unit;
- wherein each first color sub-pixel pair and each second color sub-pixel pair are arranged adjacent to each other in the column direction; and
- wherein each pixel unit is one of the following matrix arrangements with 2 rows and 8 columns (2×8):

R R G G B B W W
B B W W R R G G (arrangement 12),
R R G G W W B B
W W B B R R G G (arrangement 13),
G G R R W W B B
W W B B G G R R (arrangement 14), and
R R G G B B W W
B B W W R R G G (arrangement 15).

8. A display apparatus, comprising:

a display panel, comprising a plurality of pixel units, wherein each pixel unit comprises 18 sub-pixels arranged in matrix manner along a column direction and a row direction;

an input unit, for receiving an image signal; and a sub pixel rending (SPR) unit, comprising a wide viewing angle gamma lookup table and a narrow viewing angle gamma lookup table to support generating corresponding performance values for the sub-pixels;

wherein each pixel unit comprises:
- 3 first color sub-pixel pairs, each of which is formed by 2 first color sub-pixels arranged adjacent to each other, wherein the first color sub-pixel pairs are separately provided in different columns and different rows of the pixel unit;
- 3 second color sub-pixel pairs, each of which is formed by 2 second color sub-pixels arranged adjacent to each other, wherein the second color sub-pixel pairs are separately provided in different columns and different rows of the pixel unit; and
- 3 third color sub-pixel pairs, each of which is formed by 2 third color sub-pixels arranged adjacent to each other, wherein the third color sub-pixel pairs are separately provided in different columns and different rows of the pixel unit;
- wherein each first color sub-pixel pair and each second color sub-pixel pair are arranged adjacent to each other in the column direction.

9. The display apparatus according to claim 8, wherein each pixel unit is formed by 24 sub-pixels, which comprise 8 first color sub-pixels, 8 second color sub-pixels, and 8 third color sub-pixels, and each pixel unit comprises:
- 4 first color sub-pixel pairs, each of which is formed by 2 first color sub-pixels arranged adjacent to each other, wherein the first color sub-pixel pairs in adjacent rows are separately provided in different columns of the pixel unit;
- 4 second color sub-pixel pairs, each of which is formed by 2 second color sub-pixels arranged adjacent to each other, wherein the second color sub-pixel pairs in adjacent rows are separately provided in different columns of the pixel unit; and
- 4 third color sub-pixel pairs, each of which is formed by 2 third color sub-pixels arranged adjacent to each other, wherein the third color sub-pixel pairs in adjacent rows are separately provided in different columns of the pixel unit.

10. A display apparatus:

a display panel, comprising a plurality of pixel units, wherein each pixel unit comprises 16 sub-pixels arranged in matrix manner along a column direction and a row direction;

an input unit, for receiving an image signal; and a sub pixel rending (SPR) unit, comprising a wide viewing angle gamma lookup table and a narrow viewing angle gamma lookup table to support generating corresponding performance values for the sub-pixels;

wherein each pixel unit comprises:
- 4 first color sub-pixels, 4 second color sub-pixels, 4 third color sub-pixels, and 4 fourth color sub-pixels;
- wherein the first color, the second color, the third color, and the fourth color are different;
- wherein at least 2 first color sub-pixel pairs, each of which is formed by 2 first color sub-pixels arranged adjacent to each other, and the first color sub-pixel pairs are separately provided in different columns and different rows of the pixel unit;
- wherein at least 2 second color sub-pixel pairs, each of which is formed by 2 second color sub-pixels arranged adjacent to each other, and the second color sub-pixel pairs are separately provided in different columns and different rows of the pixel unit;
- wherein at least 2 third color sub-pixel pairs, each of which is formed by 2 third color sub-pixels arranged adjacent to each other; and
- wherein each first color sub-pixel pair and each second color sub-pixel pair are arranged adjacent to each other in the column direction.

11. The display apparatus according to claim 10, wherein the third color sub-pixels in adjacent rows are located in a first column, and the fourth color sub-pixels in adjacent rows are located in a second column.

12. The display apparatus according to claim 10, wherein each pixel unit comprises:
- 2 first color sub-pixel pairs, each of which is formed by 2 first color sub-pixels arranged adjacent to each other, wherein the first color sub-pixel pairs in adjacent rows are separately provided in different columns of the pixel unit;

2 second color sub-pixel pairs, each of which is formed by 2 second color sub-pixels arranged adjacent to each other, wherein the second color sub-pixel pairs in adjacent rows are separately provided in different columns of the pixel unit;

2 third color sub-pixel pairs, each of which is formed by 2 third color sub-pixels arranged adjacent to each other, wherein the third color sub-pixel pairs in adjacent rows are provided in a same column of the pixel unit; and 2 fourth color sub-pixel pairs, each of which is formed by 2 fourth color sub-pixels arranged adjacent to each other, wherein the fourth color sub-pixel pairs in adjacent rows are provided in a same column of the pixel unit.

13. A display apparatus, comprising:

a display panel, comprising a plurality of pixel units, wherein each pixel unit comprises 12 sub-pixels arranged in matrix manner along a column direction and a row direction;

an input unit, for receiving an image signal; and a sub pixel rending (SPR) unit, comprising a wide viewing angle gamma lookup table and a narrow viewing angle gamma lookup table to support generating corresponding performance values for the sub-pixels;

wherein each pixel unit comprises:

2 first color sub-pixel pairs, each of which is formed by 2 first color sub-pixels arranged adjacent to each other, wherein the first color sub-pixel pairs in adjacent rows are separately provided in different columns of the pixel unit;

2 second color sub-pixel pairs, each of which is formed by 2 second color sub-pixels arranged adjacent to each other, wherein the second color sub-pixel pairs in adjacent rows are separately provided in different columns of the pixel unit;

2 third color sub-pixel pairs, each of which is formed by 2 third color sub-pixels arranged adjacent to each other, wherein the third color sub-pixel pairs in adjacent rows are provided in different columns of the pixel unit; and 2 fourth color sub-pixel pairs, each of which is formed by 2 fourth color sub-pixels arranged adjacent to each other, wherein the fourth color sub-pixel pairs in adjacent rows are provided in different columns of the pixel unit;

wherein each first color sub-pixel pair and each second color sub-pixel pair are arranged adjacent to each other in the column direction.

14. A display method for driving the display apparatus, wherein said display apparatus comprises a display panel, comprising a plurality of pixel units, wherein each pixel unit comprises 12 sub-pixels arranged in matrix manner along a column direction and a row direction;

an input unit, for receiving an image signal; and a sub pixel rending (SPR) unit, comprising a wide viewing angle gamma lookup table and a narrow viewing angle gamma lookup table to support generating corresponding performance values for the sub-pixels;

wherein each pixel unit comprises:

at least 2 first color sub-pixel pairs, each of which is formed by 2 first color sub-pixels arranged adjacent to each other, wherein the first color sub-pixel pairs are separately provided in different columns and different rows of the pixel unit;

at least 2 second color sub-pixel pairs, each of which is formed by 2 second color sub-pixels arranged adjacent to each other, wherein the second color sub-pixel pairs are separately provided in different columns and different rows of the pixel unit; and at least 2 third color sub-pixel pairs, each of which is formed by 2 third color sub-pixels arranged adjacent to each other;

wherein each first color sub-pixel pair and each second color sub-pixel pair are arranged adjacent to each other in the column direction; and wherein each pixel unit is formed by 12 sub-pixels; the third color sub-pixels are separately arranged adjacent to one of the first color sub-pixel pairs and one of the second color sub-pixel pairs in the row direction; and said display method comprising:

receiving the image signal to the input unit;

receiving an interference pattern to the input unit, wherein the interference pattern comprises a dark zone and a bright zone;

generating, by the bright zone, a narrow viewing angle performance value according to the image signal and the narrow viewing angle gamma lookup table;

adjusting, by the SPR unit, the narrow viewing angle performance value as a first performance value and a second performance value when the narrow viewing angle performance value is not greater than a preset performance value, wherein the preset performance value is related to the wide viewing angle gamma lookup table;

outputting separately the first performance value and the second performance value to the sub-pixels of one of the sub-pixel pairs of the bright zone; and outputting the narrow viewing angle performance value to the sub-pixel pairs of the pixel unit when the narrow viewing angle performance value is greater than the preset performance value (Lhalf).

15. The display method according to claim 14, wherein adjusting, by the SPR unit, the narrow viewing angle performance value as the first performance value and the second performance value when the narrow viewing angle performance value is not greater than the preset performance value comprises:

adjusting the narrow viewing angle signal according to a first weight to obtain the first performance value, wherein the first weight is less than 1; and adjusting the narrow viewing angle signal according to a second weight to obtain the second performance value, wherein the second weight is greater than 1.

* * * * *